United States Patent [19]
Takahashi et al.

[11] Patent Number: 5,227,674
[45] Date of Patent: Jul. 13, 1993

[54] SEMICONDUCTOR INTEGRATED CIRCUIT DEVICE

[75] Inventors: Toshiro Takahashi; Masaaki Ohkawa, both of Ohme; Kazuo Koide, Iruma, all of Japan

[73] Assignee: Hitachi, Ltd., Tokyo, Japan

[21] Appl. No.: 743,746

[22] Filed: Aug. 12, 1991

[30] Foreign Application Priority Data

Sep. 12, 1990 [JP] Japan .................................. 2-242257

[51] Int. Cl.$^5$ ............................................... G11C 7/00
[52] U.S. Cl. .................................. 307/279; 307/272.2; 307/443; 377/79; 377/117
[58] Field of Search ............... 307/279, 243, 272.2, 307/443; 377/78, 79, 117, 105

[56] References Cited
U.S. PATENT DOCUMENTS

| | | | |
|---|---|---|---|
| 3,917,961 | 11/1975 | Reed | 307/272.2 X |
| 4,409,680 | 10/1983 | Schnathorst et al. | 377/79 X |
| 4,970,407 | 11/1990 | Patchen | 307/279 X |
| 5,023,475 | 6/1991 | Ducourant | 307/279 X |
| 5,028,814 | 7/1991 | Sung et al. | 307/279 X |
| 5,049,760 | 9/1991 | Ooms | 307/272.2 X |
| 5,095,225 | 3/1992 | Usui | 307/279 |

FOREIGN PATENT DOCUMENTS 59-79632  5/1984  Japan .
62-258514 11/1987  Japan .

OTHER PUBLICATIONS

"Second-generation floating-point arithmetic co-processor with a 32-bit bus" Nikkei Electronics, Jul. 13, 1987, No. 425, Nikkei McGraw-Hill, pp. 123-138.

Primary Examiner—Eugene R. LaRoche
Assistant Examiner—Do Hyun Yoo
Attorney, Agent, or Firm—Fay, Sharpe, Beall, Fagan, Minnich & McKee

[57] ABSTRACT

A flip-flop circuit includes a data input terminal, a data output terminal, a memory circuit and a bypass circuit having a shorter delay time than that of the memory circuit. The memory circuit and the bypass circuit are connected in parallel between the data input terminal and the data output terminal so that the data are outputted to the data output terminal through the bypass circuit when the data are written in the memory circuit. As a result, the delay time of the flip-flop circuit is shortened.

25 Claims, 11 Drawing Sheets

5,227,674

SEMICONDUCTOR INTEGRATED CIRCUIT DEVICE

BACKGROUND OF THE INVENTION

The present invention relates to a semiconductor integrated circuit device including a flip-flop circuit and, more particularly, to a semiconductor integrated circuit device which has its logical operation timing controlled by the clock synchronization of a flip-flop circuit arranged in a data transmission path. More specifically, the present invention relates to a technology which is effective if applied to a logical LSI such as a microprocessor or a microcomputer.

A logical LSI such as the microprocessor is enabled to perform a data processing, while preventing a malfunction easily, by arranging registers in the data transmission paths between the logical circuits including an arithmetic and logic operator, a multiplexer, a shifter, a decoder and a selector contained in the execution unit of the LSI and by synchronizing the individual registers in response to clock signals. The registers to be adopted are generally exemplified by a plurality of static flip-flop circuits which can latch data stably irrespective of the influences of coupling noises, a low leakage current and alpha rays.

This logical LSI has its performance determined by the clock signal cycle for regulating the operations of the static flip-flop circuits which are arranged in the data transmission paths. Specifically, if data are outputted from the registers, i.e., the static flip-flop circuits in synchronism with changes in the clock signals, they are subjected to a variety of logical operations. Thus, the cycle of the clock signals is determined so that a register at a subsequent stage may input the data in synchronism with the changes in the clock signals while being timed with the arrival of the operated result at the subsequent register.

Incidentally, such microprocessor is disclosed on pp. 124 to 138 of "NIKKEI ELECTRONICS (of Jul. 13, 1987)" issued by NIKKEI McGRAW-HILL.

SUMMARY OF THE INVENTION

In the logical LSI of this kind of the prior art, however, it has been clarified by us: that either the operation delay time until the data latched in the static flip-flop circuits constituting the register is outputted after a change in the clock signal is fed to the static flip-flop circuits or the operation delay time until the writing operation of the data is started in synchronism with the change in the clock signal may grow several times as large as that of the ordinary gates such as NAND gates or NOR gates thereby to obstruct the high performance or speedup of the logical LSI. The reason for this fear will be described in the following. The static flip-flop circuit acting as a sequence circuit has an increased number of series gate stages between its data input terminal and data output terminal because it includes a data logic gate for latching the data statically between its data input terminal and data output terminal and a clock logic gate for operating the data logic gate in synchronism with the clock signal.

The flip-flop circuit to be noted here takes a position as a synchronizing sequential circuit. We have examined the flip-flop circuit to be used as a unit cell or a standard cell of an automatic wiring line for a design automation or the like, especially, a level sense type flip-flop circuit, as shown in FIG. 8A.

In FIG. 8A: reference characters G101 to G103 and G106 to G108 designate inverter gates; characters G104 and G105 designate NAND gates; and characters T101 and T102 designate transfer gates. The aforementioned NAND gates G104 and G105 are connected in a feedback manner through the transfer gate T101 to constitute a static latch. The flip-flop circuit, as shown, is utilized as the standard cell, and the driving abilities and capacitative loads of circuits to be connected with the input/output terminals of the flip-flop circuit are actually diverse for the semiconductor integrated circuit devices making use of the flip-flop. Considering this diversity, there are provided the aforementioned inverter gates G101, G103, G106 and G107. Specifically, the inverter gate G101 performs a waveform shaping so that the setup time for regulating the data write timing, the hold time and the minimum clock pulse width may not be influenced by the gradient of the change in the input waveform of a clock signal CLK. The aforementioned inverter gate G103 has an amplifying function to prevent the write time from being influenced by the driving ability of the prestage circuit of the input of the data D. The aforementioned inverter gates G106 and G107 prevent the data outputting operation from being influenced by the output side load capacity. In order that the set and reset operations may be preferred to the write and read operations of the input data D to be fetched in response to the level change of the clock signal CLK, the aforementioned inverter gates G106 and G107 have their inputs connected with the output of the NAND gate G105 but not the input of the NAND gate G104.

In this flip-flop circuit, therefore, the fixation of the outputs of the six-stage gates G101, T102, G104, G105, G106 and G108 has to be awaited until an inverted output Q* (wherein symbol * means a negative logic) has to be obtained after the clock signal CLK has been changed to the high level. Moreover, the fixation of the outputs of the five-stage gates G101, T102, G104, G105 and G107 has to be awaited till a non-inverted output is obtained. This increases the delay till the fixation of the data output after the change of the clock signal CLK to the high level.

FIG. 8B shows another flip-flop circuit which has also been investigated by us. In the flip-flop circuit, as shown, two composite gates, i.e., two OR/AND inverter gates G113 and G114 constitute the static latch. A waveform shaping inverter gate G111 is arranged at the input stage of the clock signal CLK. At the output, there are arranged inverter gates G115 and G116 for preventing the writing operation from being influenced by the output side load capacity. There is further provided an inverter gate G112 for inverting the input data D. This flip-flop circuit also has to await the fixations of the outputs of the four stage gates G111, G113, G114 and G116, or G111, G113, G114 and G115 till the inverted output Q* and the non-inverted output Q are obtained after the clock signal CLK has been changed to the high level. As a result, a large delay is established like before until the data output is fixed after the change of the clock signal CLK to the high level.

Thus, the clock synchronization type flip-flop circuit of the prior art is followed by a relatively long delay until the data output is fixed after the level change of the clock signal. As a result, the clock signal period is necessarily elongated to retain a desired time period for the setup time or hold time for the clock signal. Thus, a speedup is limited in the logical LSI which has its operation speed determined by the cycle of the clock signal for regulating the operation of such flip-flop circuit. If such flip-flop circuit is present in a critical path, for example, the operation delay time of the flip-flop circuit blocks the speedup of the logical LSI.

Especially in respect to the speedup, it is possible to adopt an ECL circuit. This adoption is not always advantageous because the ECL circuit is more difficult to highly integrate and consumes a drastically higher power than the MOS type semiconductor integrated circuit device.

An object of the present invention is to speed up the logical operation of a semiconductor integrated circuit device by reducing the operation delay of a clock synchronization type flip-flop circuit.

Another object of the present invention is to provide a semiconductor integrated circuit device which has its performance determined by a clock signal cycle for regulating the operation of the flip-flop circuit and which is enabled to perform the logical operation at a high speed in respect of the performance of the flip-flop circuit while realizing a high integration and a low power consumption.

The aforementioned and other objects and novel features of the present invention will become apparent from the following description to be made with reference to the accompanying drawings.

A representative of the present invention to be disclosed hereinafter will be briefly described in the following.

A semiconductor integrated circuit device having its logical operation timing controlled by the clock synchronization for a flip-flop circuit arranged in a data transmission path adopts a flip-flop circuit having the operation characteristics contained in a region below a curve (a) of FIG. 4.

Moreover, a semiconductor integrated circuit device having its logical operation timing controlled by the clock synchronization for a flip-flop circuit arranged in a data transmission path adopts a flip-flop circuit, in which both a memory circuit and a bypass circuit having less series gate stages are connected in parallel between the data input and output terminals of the flip-flop circuit.

Still moreover, a semiconductor integrated circuit device having its logical operation timing controlled by the clock synchronization for a flip-flop circuit arranged in a data transmission path adopts a flip-flop circuit, in which both a memory circuit and a bypass circuit are connected in parallel such that the bypass circuit has a shorter propagation delay time of data from the aforementioned data input terminal to the output terminal than the memory circuit.

The aforementioned bypass circuit transmits the data to be written in the memory circuit to the output terminal while bypassing the logic of the memory circuit. In case the conflict between the latched data before the fixation of the output of the memory circuit and the output data of the bypass circuit is to be prevented, the aforementioned flip-flop circuit may contain switch means for bringing the aforementioned bypass circuit into a state to conduct with the aforementioned data output terminal, when in the data writing operation of the aforementioned memory circuit, and for bringing the aforementioned bypass circuit into a state not to conduct with the aforementioned data output terminal when in the data latching state of the aforementioned memory circuit.

The aforementioned switch means to be adopted can be exemplified by such one or more means selected from the switch circuits, logic gates and clocked gates as have their conducting/inconducting states switched on the basis of the same clock signal as that for controlling the writing operation of the aforementioned memory circuit.

Furthermore, a semiconductor integrated circuit device having its logical operation timing controlled by the clock synchronization for a flip-flop circuit arranged in a data transmission path may adopt a flip-flop circuit, in which both a memory circuit and a bypass circuit are connected in parallel between the data input and output terminals of the flip-flop circuit and which include means for transmitting the output of the bypass circuit to the output terminal, when in the data writing operation of the memory circuit, and for transmitting the output of the memory circuit to the aforementioned output terminal when in the data latching state of the memory circuit.

In order to stabilize the operation or unify the operational specifications irrespective of the circuit structure to which the flip-flop circuit is to be applied, on the other hand, there may be provided means such as a gate or buffer for preventing the setup time and hold time for writing the data in the aforementioned memory circuit from being highly dependent upon the magnitude of the capacitative load to be coupled to the data output terminal.

In order to correspond to the structure having the non-inverted and inverted outputs, there may be separately included a non-inversion outputting bypass circuit and an inversion outputting bypass circuit.

In order to stabilize the data storage while being prevented from being influenced by the coupling noises or the low leakage current, there may be adopted a memory circuit of the type for latching the data statically.

In case the set/reset operations of the memory circuit, if any, in the entirety of the flip-flop circuit are to be preferred to no matter what state the lock signal might be in, it is desirable to provide the bypass circuit with the set/reset functions.

In case the flip-flop circuit is equipped with two memory circuits of series connected master and slave stages, it is desirable to connect the bypass circuit in parallel with the slave stage.

In respect of the high integration and the low power consumption, the semiconductor integrated circuit device including the aforementioned flip-flop circuit may be constructed of a complementary MOS circuit type.

In respect of improving the driving ability of the flip-flop circuit, this flip-flop circuit can be constructed of a BI-CMOS circuit containing a bipolar transistor and a MOS transistor.

Simultaneously as the memory circuit fetches and latches the input data in synchronism with the change in the clock signal, according to the means thus far described, the bypass circuit connected in parallel with the memory circuit outputs data according to the input data. Since the bypass circuit is not followed by the storing operation or has less series-connected stage built-in gates or less data transmission delay from the input to output terminals than the memory circuit, the bypass circuit outputs the data corresponding to the input data at a high speed before the end of the writing operation of the aforementioned input data in the memory circuit. Thus, the timing till the data corresponding to the input data are outputted to the output terminal of the flip-flop after the input data are inputted to the input terminal of the flip-flop in synchronism with the change in the clock signal is accelerated. This reduces the operation delay of the clock synchronization type flip-flop circuit. In a semiconductor integrated circuit device such as a microprocessor or a microcomputer having its performance determined by the clock signal cycle for regulating the operation of a flip-flop circuit, the aforementioned clock signal cycle can be speeded up to accelerate the logical operation of the aforementioned semiconductor integrated circuit device.

When such semiconductor integrated circuit device is constructed of the MOS type semiconductor integrated circuit, the overall operation of not only the flip-flop circuit but also the LSI is further speeded up according to the scaling rule by making the elements finer and promoting the low supply voltage so that a faster logical operation can be achieved in respect of the performance of the flip-flop circuit without sacrificing the high integration and the lower power consumption.

DESCRIPTION OF THE PREFERRED EMBODIMENTS

Figure 2:
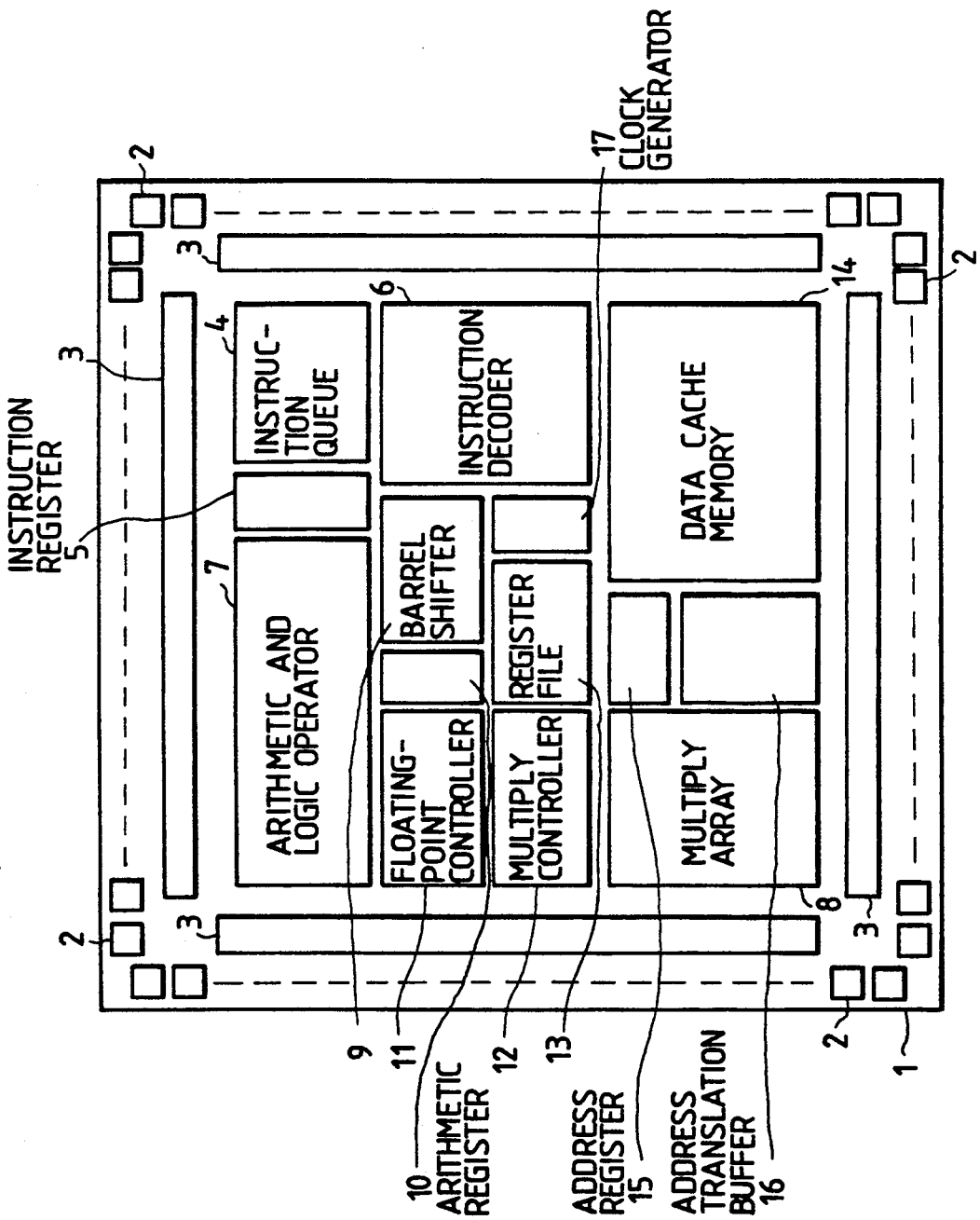
FIG. 2 is a layout showing the chip of a microprocessor according to one embodiment of the present invention.

FIG. 2 is a layout showing the chip of a microcomputer or microprocessor according to one embodiment of the present invention.

In FIG. 2, reference numeral 1 designates one semiconductor substrate made of silicon. This semiconductor substrate 1 is arranged in its outer periphery, for example, with a number of bonding pads 2 and regions 3 for forming an input buffer, an output buffer and an input/output buffer. Inside of the aforementioned forming regions 3, there is an instruction control unit including an instruction queue 4 for pre-fetching an instruction, an instruction register 5 for fetching the instruction from the instruction queue 4 in a predetermined procedure, and an instruction decoder 6 for decoding the instruction latched by the instruction register 5 to generate a variety of control signals. There are further provided: arithmetic means including an arithmetic and logic operator 7, a multiply array 8, a barrel shifter 9 and an arithmetic register 10; and control means such as a floating-point controller 11 and a multiply controller 12. Further provided are a register file 13, a data cache memory 14, an address register 15, an address translation buffer 16 and a clock generator 17. When the instruction fetched by the instruction register 5 is decoded by the instruction decoder 6, this microprocessor 1 executes the decoded instruction by performing the arithmetic of the data and addresses through the various operators and registers.

Figure 3:
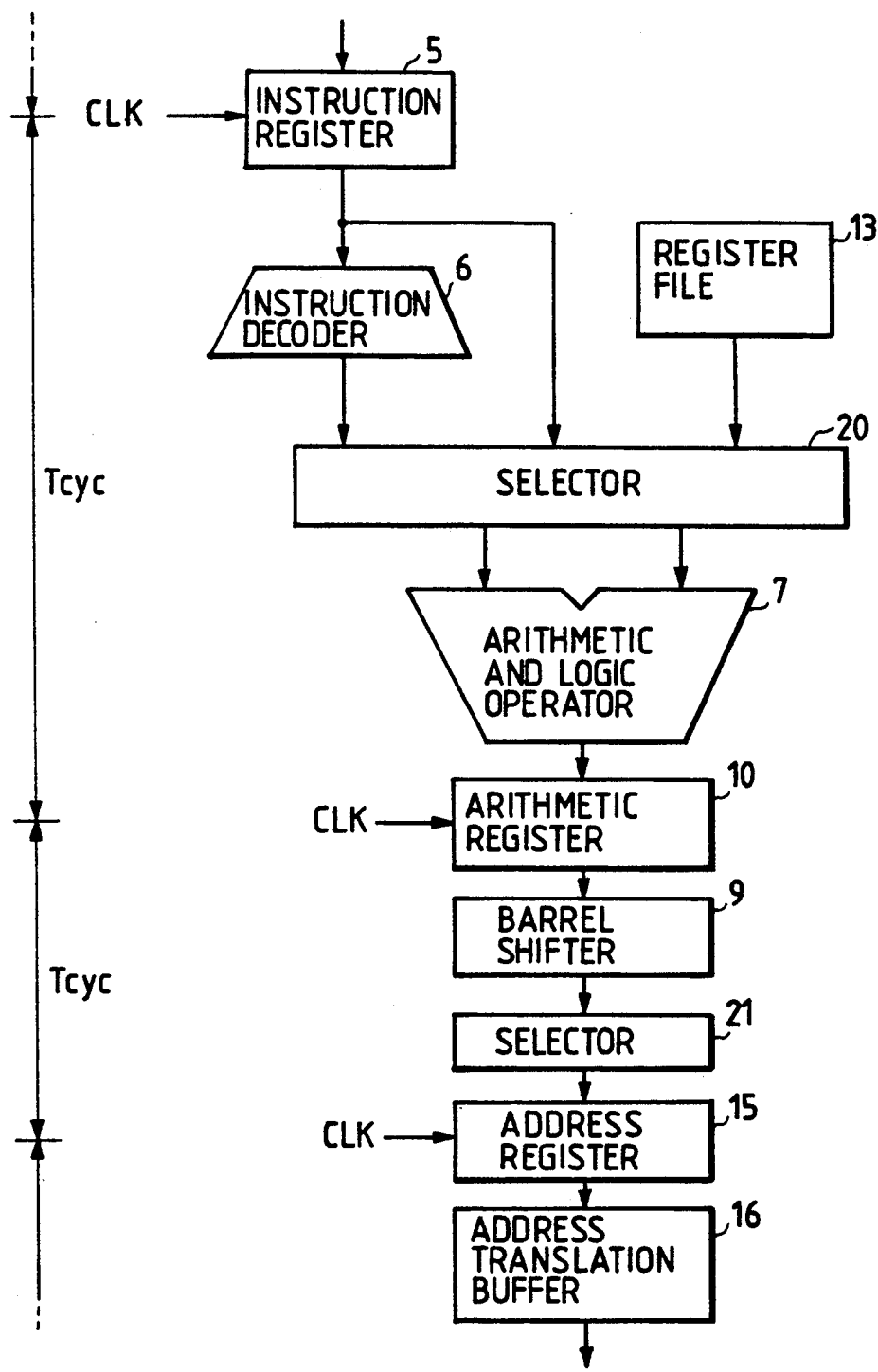
FIG. 3 is a block diagram showing one embodiment of a critical path.

FIG. 3 shows one example of a data transmission path, e.g., the critical path for indexing the performance of the microprocessor 1 shown in FIG. 2. The critical path, as shown, is one for generating an instruction address in response to a jump instruction, although not especially limitative thereto. The instruction register 5, the arithmetic register 10 and the address register 15 write and latch the data in synchronism with a change in a clock signal CLK, for example. The instruction register 5 inputs, latches and outputs the instruction in synchronism with the change in the clock signal CLK. The instruction thus outputted is decoded by the instruction decoder 6 and fed through the selector 20 to the arithmetic and logic operator 7, the operated result of which is transmitted to the arithmetic register 10. In order that the operated result may be normally transmitted to a downstream stage without any malfunction, its data must reach the input of the arithmetic register 10 before a next change in the clock signal CLK is given to the arithmetic register 10, namely, within a cycle time Tcyc. Likewise, the data, which are to be outputted from the arithmetic register 10 and operated by the barrel shifter 9 until they are transmitted to the address register 15 through a selector 21, must have reached the input of said address register 15 within the cycle time Tcyc. The aforementioned instruction register 5, the arithmetic register 10 and the address register 15 are composed of flip-flop circuits in a number corresponding to that of its component bits, whereas the instruction decoder 6 and the arithmetic and logic operator 7 are composed of a NAND gate, a NOR gate, an inverter gate and so on. As represented by the critical path of FIG. 3, in the microprocessor 1 of the present embodiment having its logical operation timing controlled by the clock synchronization of a flip-flop circuit arranged in the data transmission path, the cycle time Tcyc has to be shortened for speeding up the data processing. For this shortening, it is necessary to reduce the operation delay time of the combination circuit of the NAND gate or the like and to shorten the delay time drastically until the normal data are outputted after the clock signal CLK has changed in the flip-flop circuit.

Figure 1:
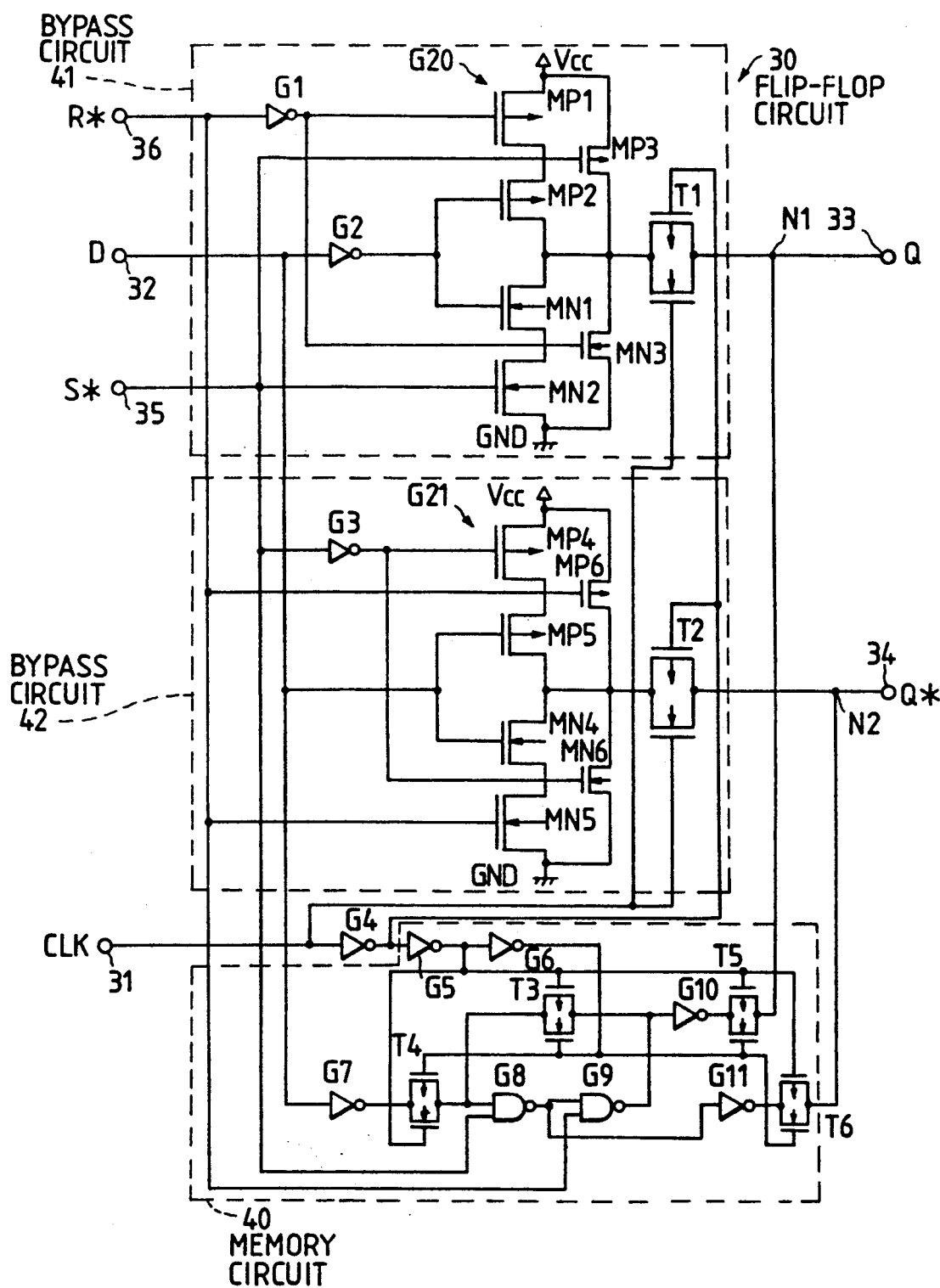
FIG. 1 is a circuit diagram showing one example of a level sense type flip-flop circuit which is applied to a semiconductor integrated circuit device according to the present invention.

FIG. 1 shows one example of the flip-flop circuit for constructing the aforementioned various registers. A flip-flop circuit 30, as shown in FIG. 1, is of level sense type for inputting the data in accordance with the level of the clock signal CLK. This flip-flop circuit 30 has a clock input terminal 31, a data input terminal 32, a data non-inversion output terminal 33, a data inversion output terminal 34, a set terminal 35 and a reset terminal 36. A memory circuit 40, a non-inversion outputting bypass circuit 41 and an inversion outputting bypass circuit 42 are connected in parallel between the data input and output terminals and are controlled by a common clock signal CLK, a set signal S* and a reset signal R*. Letters Vcc appearing in FIG. 1 designate a supply voltage of 2 V, and letters GND designate a ground potential of 0 V.

The aforementioned non-inversion outputting bypass circuit 41 includes a transmission path for input data, which is constructed of: an inverter gate G2; a clocked inverter gate G20 composed of two p-channel type MOS or MIS type field effect transistors (which will be shortly referred to as the "MOS transistors") MP1 and MP2 and two n-channel type MOS transistors MN1 and MN2; and a complementary MOS transfer gate (which will be shortly referred to as the "transfer gate") T1.

The aforementioned inversion outputting bypass circuit 42 includes a transmission path for the input data, which is constructed of: a clocked inverter gate G21 composed of two p-channel type MOS transistors MP4 and MP5 and two n-channel type MOS transistors MN4 and MN5; and a transfer gate T2.

The aforementioned memory circuit 40 includes: a static clutch composed of a transfer gate T3 and two NAND gates G8 and G9; a non-inversion data outputting transmission path composed of an inverter gate G7, a transfer gate T4, NAND gates G8 and G9, a transfer gate T3, an inverter gate G10 and a transfer gate T5; and an inversion data outputting transmission path composed of an inverter gate G7, a transfer gate T4, NAND gates G8 and G9, a transfer gate T3, an inverter gate G11 and a transfer gate T6.

The set/reset functions of the flip-flop circuit 30 are borne by the memory circuit 40 and the bypass circuits 41 and 42 such that the set function is dominated in the memory circuit 40 by the NAND gate G8 made responsive to the set signal S* and such that the reset function is dominated by the NAND gate G9 made receptive of the reset signal R*. In the non-inversion outputting bypass circuit 41, the set/reset functions are dominated by the clocked inverter gate G20, a p-channel type MOS transistor MP3 and an n-channel MOS type transistor MN3. In the inversion outputting bypass circuit 42, moreover, the set/reset functions are dominated by the aforementioned clocked inverter gate G21, a p-channel MOS transistor MP6 and an n-channel type MOS transistor MN6.

The non-inverted output of the aforementioned memory circuit 40 and the output of the bypass circuit 41 are connected in a wired OR form through a node N1 so that the outputs to be selected are selected by the transfer gates T1 and T5 to be complementarily switched. Moreover, the inverted output of the memory circuit 40 and the output of the bypass circuit 42 are connected in the wired OR form through a node N2 so that the outputs to be selected are selected by the transfer gates T2 and T6 to be complementarily switched. In order to switch the transfer gates T1, T2, T5 and T6, there are arranged three-stage series inverter gates G4, G5 and G6 for transmitting the clock signal CLK.

When the clock signal CLK is raised to the high level, the transfer gates T1 and T2 are turned on to render the outputs of the bypass circuits 41 and 42 conducting with the non-inverted output terminal 33 and the inverted output terminal 34 but the output of the memory circuit 40 inconducting with the same output terminals 33 and 34. If, therefore, the data D are given from the data input terminal 32 at this time, their non-inverted output Q is fed through the bypass circuit 41 to the output terminal 33, and the non-inverted output Q* is fed through the bypass circuit 42 to the output terminal 34.

When the clock signal CLK is at the high level, the memory circuit 40 is brought into the write state so that the input data D are written in parallel with the outputting operations of the bypass circuits 41 and 42. Specifically, the write state is established by turning off the transfer gate T3 constituting the static latch together with the NAND gates G8 and G9 and by turning on the transfer gate T4 for fetching the input data D through the inverter gate G7.

If, in this write state, the set signal S* is set to the low level to instruct the setting operation, in the non-inversion outputting bypass circuit 41, the MOS transistor MN2 is inverted to its OFF state, and the MOS transistor MP3 is turned on so that the non-inverted output Q is fixed at the high level irrespective of the level of the input data D. In the inversion outputting bypass circuit 42, the MOS transistor MN6 is inverted to its ON state, and the MOS transistor MP4 is turned off so that the inverted output Q* is fixed at the low level irrespective of the level of the input data D. At this time, the memory circuit 40 is set irrespective of the logical value of the input data D by the action of the NAND gate G8 made receptive of the set signal S* at the low level. When the setting operation is instructed at this time of the writing operation, the setting operation is preferred to the control by the clock signal CLK. In other words, the non-inverted output Q and the inverted output Q* are forcibly set to the output level in the set state irrespective of the logical value of the data D fetched in synchronism with the change in the clock signal CLK. Like operations are caused in case the reset signal R* is dropped to the low level to instruct the resetting operation.

When the clock signal CLK is set to the low level, the transfer gates T1 and T2 are turned off, but the transfer gates T5 and T6 are turned on so that the outputs of the bypass circuits 41 and 42 are rendered inconducting with the non-inverted output terminal 33 and the inverted output terminal 34 so that the output of the memory circuit 40 is used as that of the flip-flop circuit 30. At this time, the memory circuit 40 has its transfer gate T4 turned off and its transfer gate T3 turned on so that the written data are statically latched. As a result, the data, which have been written in the memory circuit 40 for the high-level period of the clock signal CLK, are stably outputted from the output terminals 33 and 34 without having their levels undesirably inverted by the influences of the capacitative coupling, the low leakage current, or by alpha rays. Moreover, the data can be outputted, without being influenced by the output load capacity, by the actions of the inverter gates G10 and G11 arranged at the upstream stages of the transfer gates T5 and T6.

If, at this time, the set signal S* is dropped to the low level to instruct the setting operation, the memory circuit 40 is brought into the set state regardless of the logical value of the input data D by the action of the NAND gate G8 which is made constant by a low level of set signal S*, so that the non-inverted output Q established at the output terminal 33 is fixed at the high level whereas the inverted output Q* established at the output terminal 34 is fixed at the low level. If the setting operation is once instructed and stored in the memory circuit 40, this set state is stably maintained even if said set signal S* is negated to the high level. Like operations are performed, too, in case the reset signal R* is dropped to the low level to instruct the resetting operation.

Incidentally, the inverter gate G4 or the like arranged at the input stage of the clock signal CLK performs a waveform shaping for preventing the setup time, the hold time and the minimum clock pulse width for regulating the data writing operation from being influenced by the gradient of the change of the input waveform of the clock signal CLK.

Figure 8A:
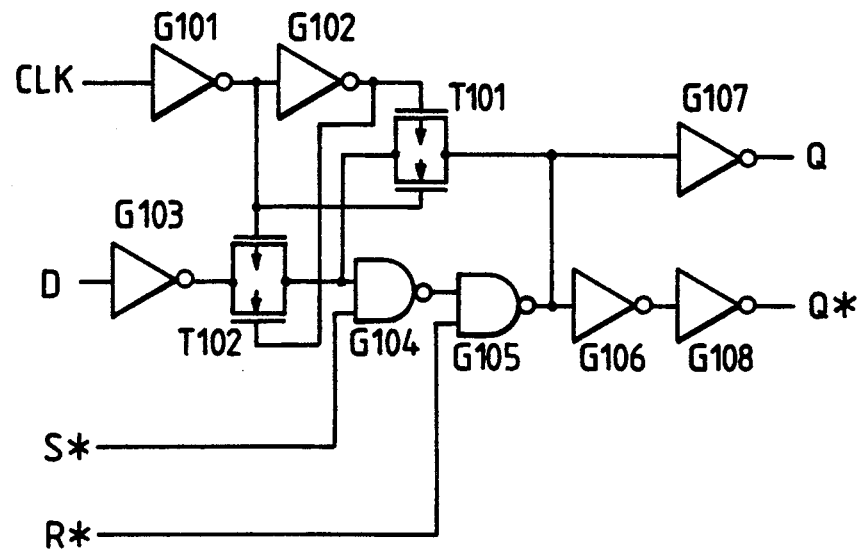
FIGS. 8A to 8B are circuit diagrams showing the flip-flop circuits which were investigated by us.

In this flip-flop circuit 30, the number of gate stages the data passes through until they are outputted after the clock signal CLK has been changed to the high level is minimized to one, i.e., each of the transfer gates T1 and T2 in the bypass circuits 41 and 42. As a result, the delay time for the normal data to be outputted from the changing timing of the clock signal is made far shorter than those of the circuits shown in FIGS. 8A and 8B. In this flip-flop circuit 30, moreover, the stabilities of the writing operation and the data outputting performance of the memory circuit 40 are warranted as in the prior art. Thus, the flip-flop circuit 30 finds its most proper application to the using mode as the unit cell or standard cell of the automatic wiring line such as the design automation, i.e., the using mode, in which it is anticipated that the driving ability and the capacitive load of the circuit to be connected with the input-/output terminals of the semiconductor integrated circuit device using the flip-flop actually are diverse.

Here, as to the sizes of the MOS transistors composing the flip-flop circuit 30, namely, with reference to the standards of the gate width of the MOS transistors MP2, MN1, MN5 and MN4, the MOS transistors composing the transfer gates T1 and T2, and the MOS transistor composing the inverter gate G4, the gate width of the MOS transistors composing the inverter gates G2 and G7 made receptive of the input data D is about half as large as the standard one so that the input capacity is reduced to accelerate the transient response speed of the input data. Moreover, the MOS transistors MP3, MN3, MP6 and MN6, and the MOS transistors composing the transfer gates T5 and T6 have gate widths which are one half of the standard value since their output nodes have the parasitic capacities of the diodes. Since, moreover, no high speed is required for the set/reset operations to be used for resetting or diagnosing the system, the MOS transistors MP1, MN2, MP4 and MN5 may have large gate input capacities. In order to augment the driving abilities of the bypass circuits 41 and 42, therefore, their transistors have their gate widths set about two to five times as large as the standard one thereby to minimize the ON resistance.

Figure 4:
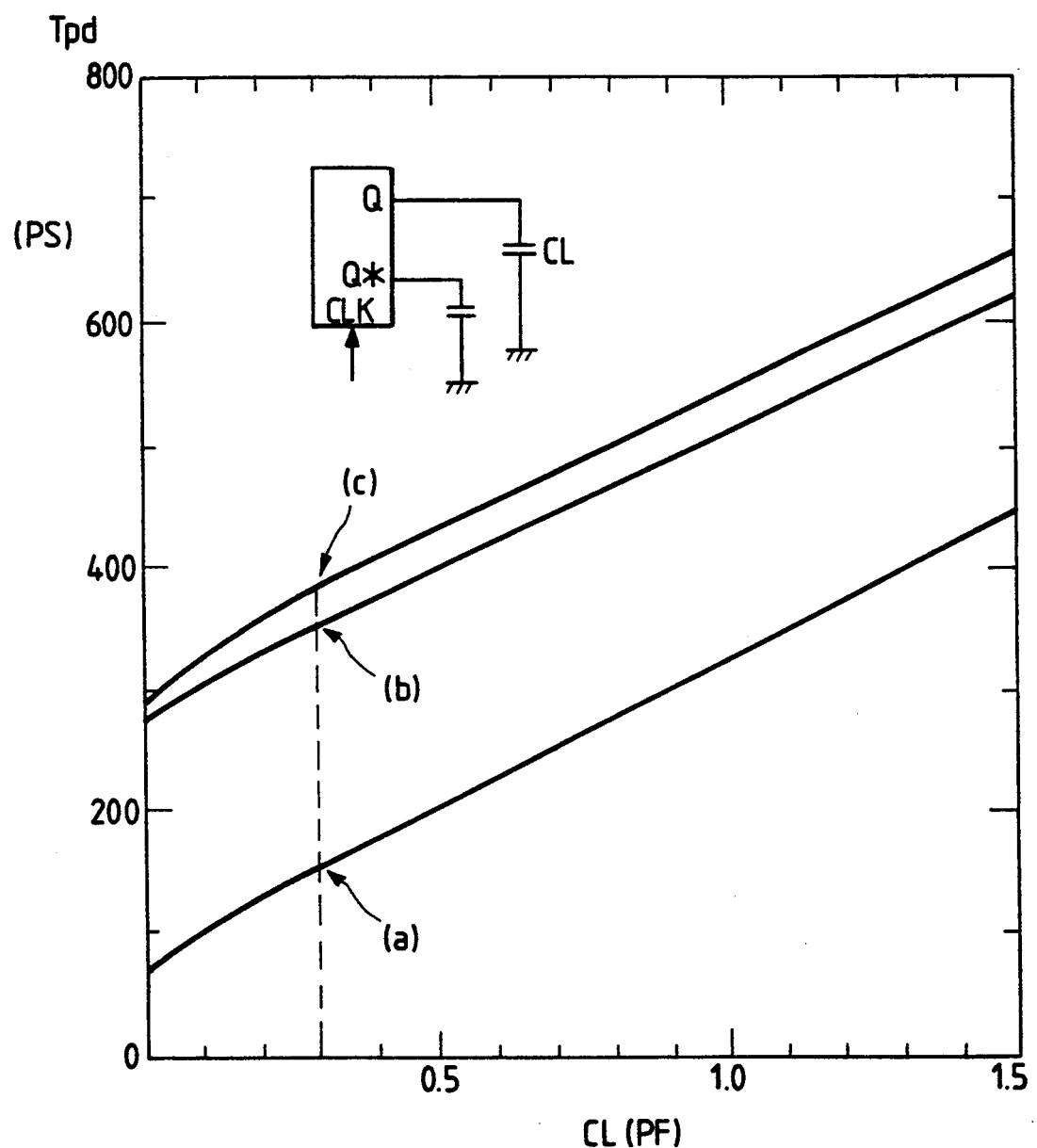
FIG. 4 is a diagram illustrating the characteristics of a flip-flop circuit which is applied to the microprocessor of FIG. 2.

FIG. 4 illustrates the characteristics of the flip-flop circuit shown in FIG. 1. These characteristics illustrate the dependency of a delay time Tpd (i.e., an average of the non-inverted output Q and the inverted output Q*) until the data are outputted after the clock signal CLK has been changed with the input terminal being fed with the data, upon a load capacity CL. A characteristic curve (a) illustrates the dependency of the flip-flop circuit 30 of FIG. 1; a characteristic curve (b) illustrates the dependency of the flip-flop circuit of FIG. 8A; and a characteristic curve (c) illustrates the dependency of the flip-flop circuit of FIG. 8B.

The characteristics of the characteristic curve (a) at the time of a load capacity of 0.3 [PF] are attained under the following simulation condition. Specifically, the flip-flop circuit is constructed of a complementary MOS circuit adopting the 0.2 [μm] process and assumes that the supply voltage is at 2.0 [V]. The MOS transistor has a standard size gate length of 0.20 [μm] and a gate width of 15 [μm], and the complementary MOS inverter gate of the standard size has an input capacity of 0.05 [PF]. However, the MOS transistors MP1, MP4, MN1 and MN4 have a gate width of 45 [μm], the MOS transistors for constituting the inverter gates G2, G3, and G5 to G11, and the MOS transistors MP3, MN3, MP6 and MN6 have a gate width of 7.5 [μm]. Incidentally, the load capacity of 0.3 [PF] is a standard one imagining the sum of the parasitic capacity (of 0.18 [PF]) of the aluminum wiring line having a length of 1 [mm] and a width of 0.7 [μm] and a gate input capacity (of 0.1 [PF]) for the fan-out=2, although not especially limitative thereto.

As represented by the characteristic curve (a), if the microprocessor 1 of the present embodiment is constructed of the MOS type semiconductor integrated circuit, not only the flip-flop circuit but also the overall circuit operation are further speeded up to that of the existing ECL circuit by promoting the fine structures of the elements and the according reduction of the supply voltage. In addition, the high integration and low power consumption, which cannot be realized by the ECL circuit, can be achieved to effect faster logical operations in respect of the performance of the flip-flop circuit.

Figure 5A:
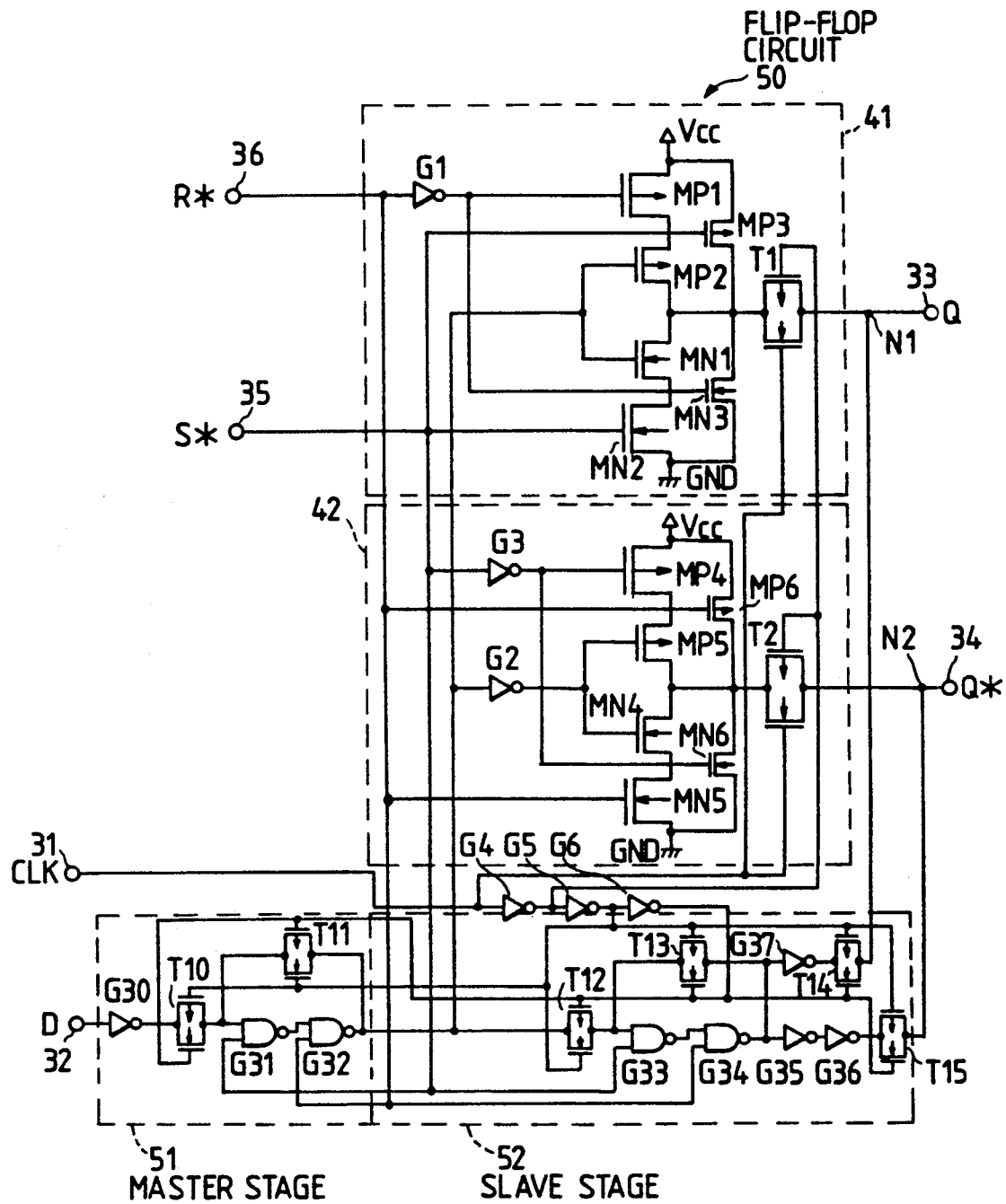
FIGS. 5A to 5E are diagrams individually showing examples of a master/slave type flip-flop circuit which is applied to the semiconductor integrated circuit device according to the present invention.

FIG. 5A shows one embodiment of the master/slave type flip-flop circuit considering the racing prevention. In FIG. 5A, the voltage Vcc is set at 2 V, and the voltage GND is set at 0 V.

As shown, a flip-flop circuit 50 is equipped with two memory circuits of master stage 51 and slave stage 52, which are connected in series between the data input terminal 32 and the output terminals 33 and 34. The non-inversion outputting bypass circuit 41 and the inversion outputting bypass circuit 42 are connected in parallel with the aforementioned slave stage 52. The master stage 51 fetches the data in response to the low level of the clock signal CLK, and the slave stage 52 fetches the data from the master stage 51 and outputs it in synchronism with the rising change of the same clock signal CLK.

The master stage 51 includes an inverter gate G30, two transfer gates T10 and T11 and two NAND gates G31 and G32, and the feedback loop composed of the gates G31, G32 and T11 constitutes the static latch. The slave stage 52 includes four transfer gates T12 to T15, two NAND gates G33 and G34, and three inverter gates G35 to G37, and the feedback loop composed of the gates G33, G34 and T13 constitutes the static latch. The bypass circuits 41 and 42 are constructed, as shown in FIG. 1. The operations can also be speeded up like those of FIG. 1 even in this master/slave type flip-flop circuit 50.

Figure 5B:
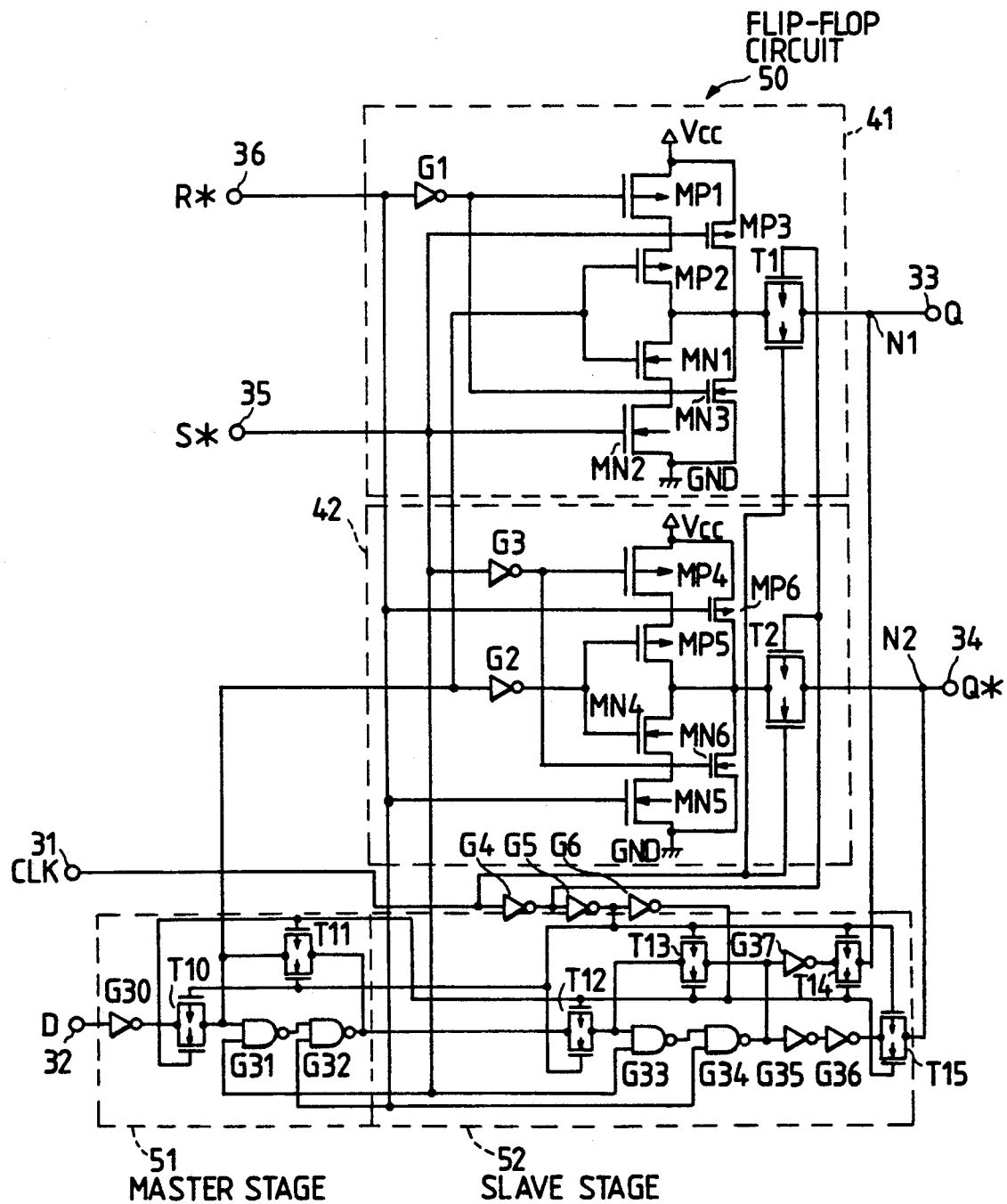

FIG. 5B shows another embodiment of the master-/slave type flip-flop circuit according to the present invention. This embodiment resembles what is shown in FIG. 5A, therefore only the differences will be described. In the embodiment of FIG. 5B, not the output of the master stage but the data D coming from the transfer gate T10 are fed as the data D to the bypass circuits 41 and 42. According to this embodiment, the setup time can be shortened.

Figure 5C:
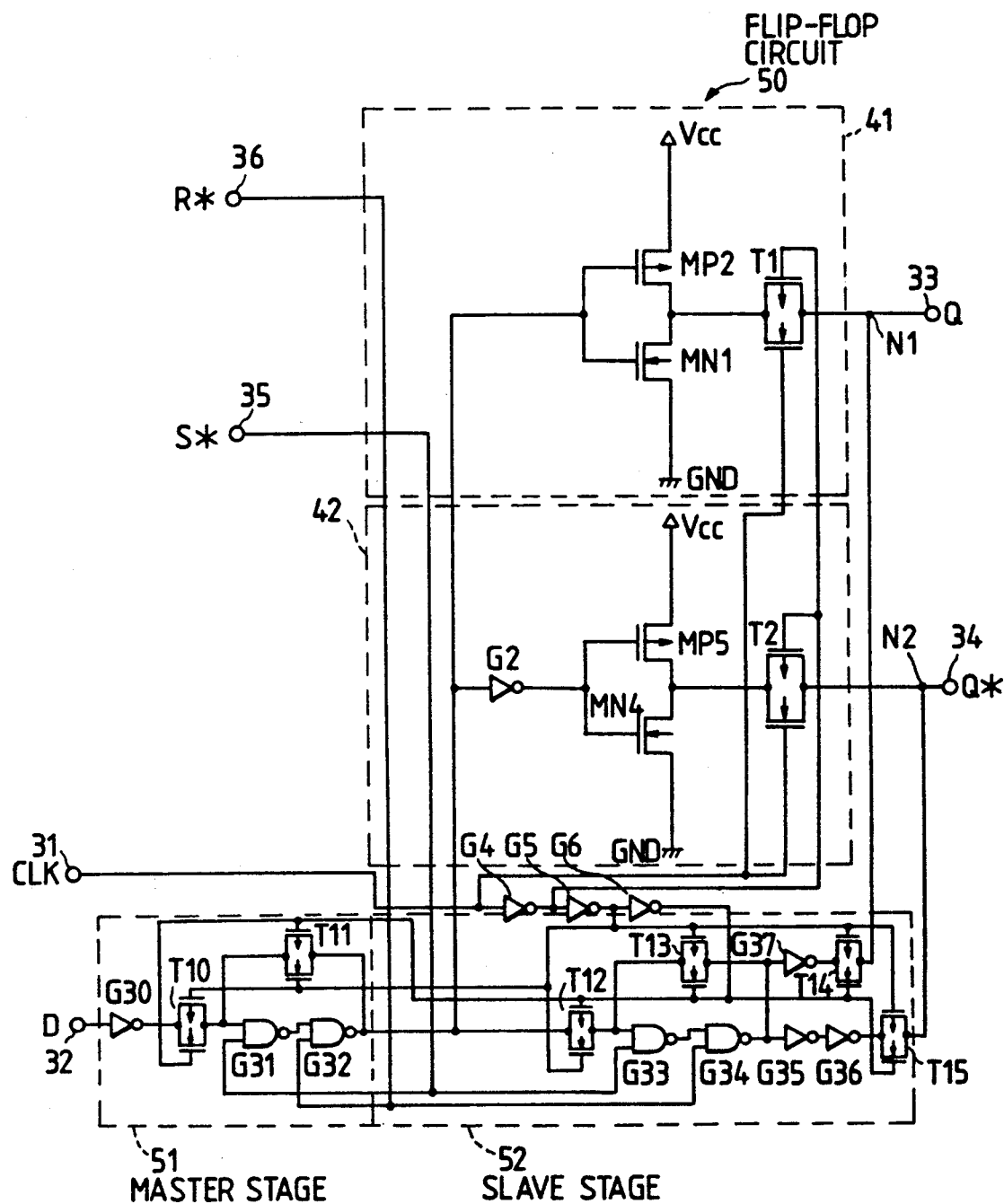

FIG. 5C shows still another embodiment of the master/slave type flip-flop circuit according to the present invention. This embodiment also resembles what is shown in FIG. 5A, so only the differences will be described. In the embodiment of FIG. 5C, the MOS transistors MN2, MN3, MN5, MN6, MP1, MP3, MP4 and MP6, and the inverters G1 and G3 are precluded from the bypass circuits 41 and 42 shown in FIG. 5A. As a result, these bypass circuits 41 and 42 are not given the set/reset functions. According to this embodiment, it is possible to reduce the number of the elements.

Figure 5D:
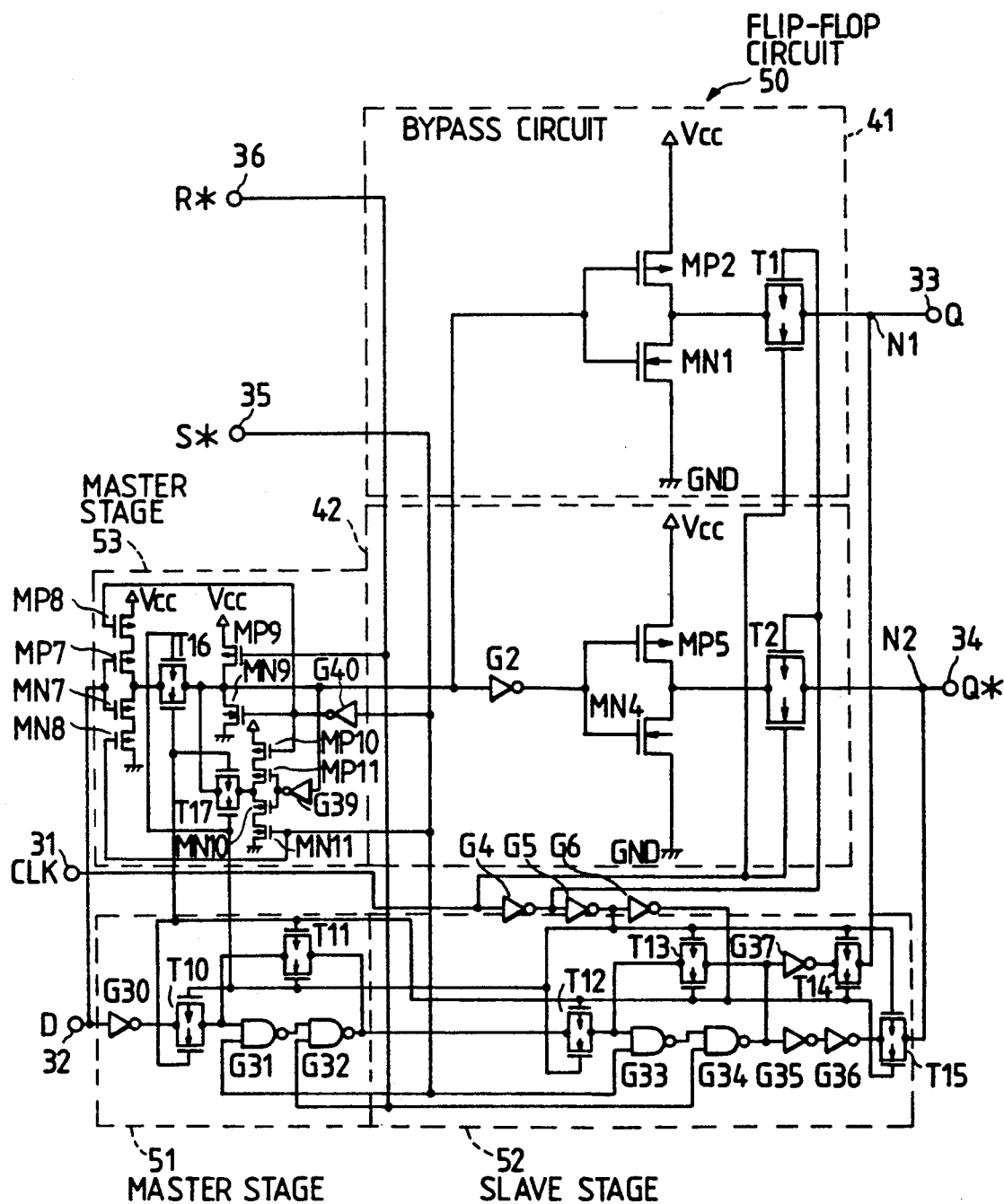

FIG. 5D shows a further embodiment of the master/slave type flip-flop circuit according to the present invention. This embodiment also resembles what is shown in FIG. 5C. The embodiment of FIG. 5D is further equipped with a master stage 53 for feeding its data to the bypass circuits 41 and 42. This master stage 53 includes: a transfer gate T16 having an action similar to that of the aforementioned transfer gate T10; a transfer gate T17 having an action similar to that of the aforementioned transfer gate T11; and a structure, as will be described in the following. Specifically, the feedback loop for forming the static latch is constructed of: an inverter G39; a transfer gate T17; and a clocked inverter circuit composed of MOS transistors MN10 and MN11 and MOS transistors MP10 and MP11. Moreover, the data D are fed to the aforementioned feedback loop through a clocked inverter circuit which is composed of MOS transistors MN7 and MN8 and MOS transistors MP7 and MP8. The aforementioned master stage 53 has its output node connected with both a MOS transistor MN9, which is to be fed with the set signal S* through the inverter G40, and a MOS transistor MP9 which is to be fed with the reset signal R*, so that it may have the set/reset functions. The inverted set signal S formed by the aforementioned inverter G40 is further fed to the aforementioned MOS transistors MP8 and MP10, and the aforementioned set signal S* is further fed to the aforementioned MOS transistors MN8 and MN11. In this embodiment, too, the aforementioned bypass circuits 41 and 42 may have the structures similar to those of the embodiment shown in FIG. 5A.

Figure 5E:
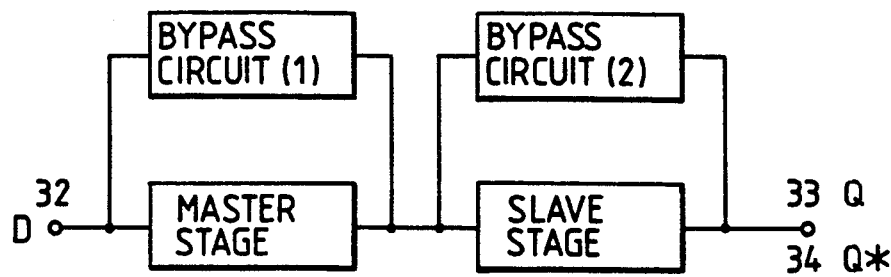

FIG. 5E shows a further embodiment of the master/slave type flip-flop circuit according to the present invention. In the present embodiment, the bypass circuit (2) is connected in parallel with the slave stage, and the bypass circuit (1) is connected in parallel with the master stage. The master stage and slave stage can use the aforementioned circuits, respectively. Likewise, the bypass circuits (1) and (2) can use the aforementioned circuits, respectively.

Figure 6:
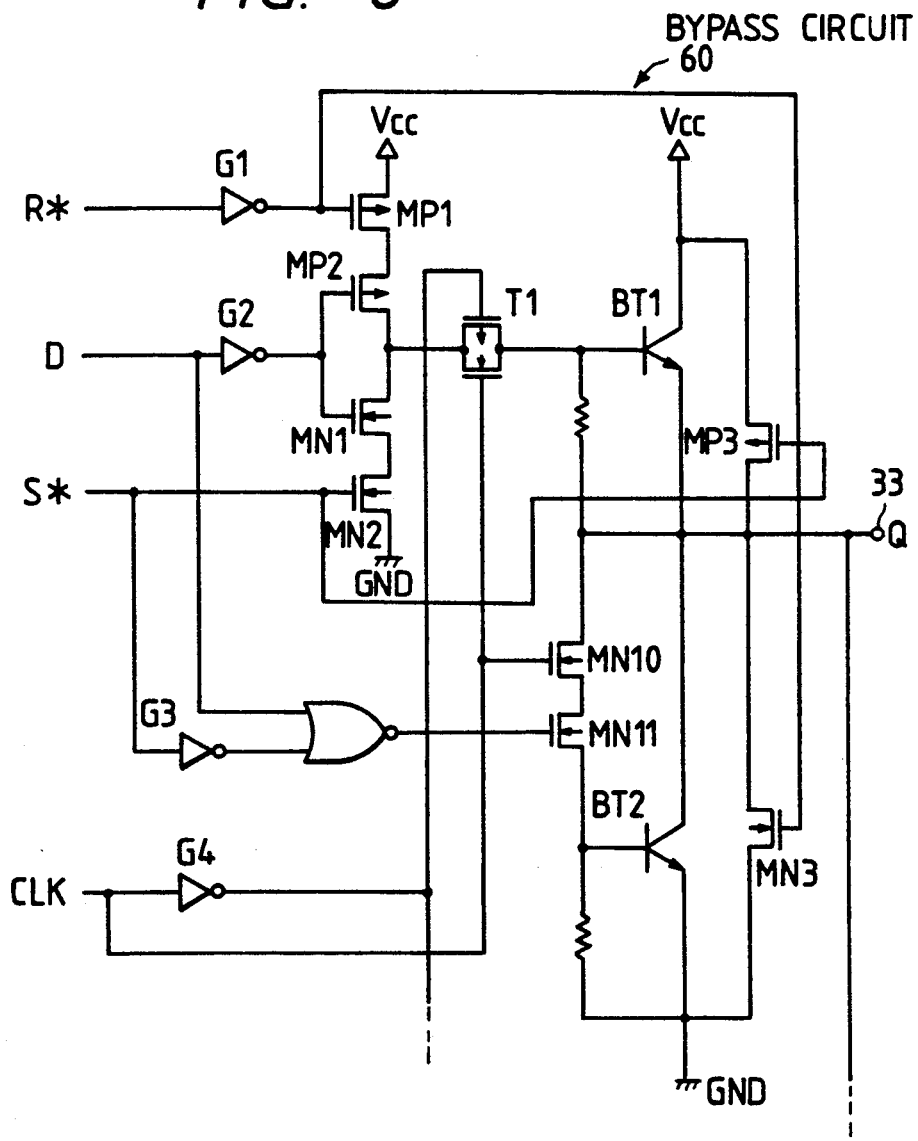
FIG. 6 is a circuit diagram showing one example of a BI-CMOS bypass circuit.

FIG. 6 shows an example of the circuit, in which a bypass circuit, e.g., a non-inversion outputting bypass circuit has a BI-CMOS output stage. This bypass circuit 60 has its output stage composed of series connected npn type bipolar transistors BT1 and BT2, and the aforementioned setting/resetting MOS transistors MP3 and MN3 are connected in parallel with the bipolar transistors BT1 and BT2. When the clock signal CLK is at the low level, the transfer gate T1 and the n-channel type MOS transistor MN10 are turned off so that the output of the bypass circuit 60 takes a high-impedance stage. When the clock signal CLK is at the high level, the transfer gate T1 and the MOS transistor MN10 are turned on so that the bipolar transistors BT1 and BT2 are complementarily switched in accordance with the switch state of the n-channel MOS transistor MN11 to output the input data D in the non-inverted state. This circuit structure can naturally be applied to the inversion outputting bypass circuit.

The bypass circuit can have its outputting operation speeded up by making a BI-CMOS output stage. This BI-CMOS technology is considered to take a position as substitutive means or transient means in case the super-high speed flip-flop circuit, as represented by the characteristic curve (a) of FIG. 4, is not used. Due to the characteristics associated with using the bipolar transistor, it is seriously difficult to drop its base-emitter voltage according to the scaling or the finer structure of the elements. In case a totem pole type bipolar output stage is used, as shown in FIG. 6, the output signal takes a high level of (Vcc−0.7 V) and a low level of (GND+0.7 V) if the base-emitter voltage of each bipolar transistor is set at 0.7 V. In case the voltage Vcc is set at a value such as 5 V whereas the voltage GND is set at a value such as 0 V, the output signal can have a sufficient amplitude. In case, however, the voltage is set at a value such as 2.0 V whereas the voltage GND is set at a value such as 0 V, the output signal cannot have an amplitude sufficient for driving the CMOS circuit at the subsequent stage. In other words, the bypass circuit of FIG. 6 has its usage limited by the values of the supply voltage Vcc and the voltage GND. The technology of speeding up the outputting operation of the bypass circuit by making the BI-CMOS structure has to take such a disadvantage that it cannot be utilized in connection with the drop of the supply voltage as the elements of the MOS semiconductor integrated circuit are made finer and highly integrated. On the other hand, the use of the flip-flop of FIGS. 1 or 5 is not limited by the value of the supply voltage (e.g., Vcc or GND).

The following effects can be attained according to the embodiments thus far described:

(1) In both the bypass circuits 41 and 42 connected in parallel with the memory circuit 40, as shown in FIG. 1, and the bypass circuits 41 and 42 connected in parallel with the slave stage 52 acting as the memory circuit, as shown in FIGS. 5A to 5E, the number of gate stages for the data to pass through until said data are outputted after the clock signal CLK has been changed to the high level is minimized to one stage, i.e., the transfer gates T1 and T2 in the bypass circuits 41 and 42. As a result, it is possible to make the delay time for the normal data to be outputted after the changing timing of the clock signal, far shorter than that of the circuit shown in FIG. 8A or 8B.

(2) Thanks to the foregoing effects, the delay time for the normal data to be outputted from the flip-flop circuit in synchronism with the change in the clock signal CLK is remarkably shortened. Thus, in the microprocessor 1 of the present embodiment, which has its logical operation timing controlled by the clock synchronization for the register composing flip-flop circuits 30 and 50 arranged in the data transmission path, the cycle time Tcyc, as shown in FIG. 3, can be shortened to realize the speedup of the data processing.

(3) If the microprocessor 1 of the present embodiment is constructed of a pure MOS type semiconductor integrated circuit device, the operation characteristics, as represented by the characteristic curve (a) of FIG. 4, can be achieved at the flip-flop circuits 30 and 50 in accordance with the scaling rule by promoting the fine structure of the elements and by the drop in the supply voltage. As a result, not only said flip-flop circuits 30 and 50 but also the overall operations of the microprocessor 1 are further speeded up to those of the existing ECL circuit. Furthermore, it is possible to achieve the high integration and low power consumption, which cannot be realized by the ECL circuit.

(4) The outputs of the bypass circuits 41 and 42 are transmitted to the output terminals 33 and 34, when in the data writing operations of the memory circuits 40 and 52, and the outputs of said memory circuits 40 and 52 are transmitted to the aforementioned output terminals 33 and 34 when in the data latching states of said memory circuits. No conflict results between the latched data of the memory circuits 40 and 52 before the writing operation and the output data of the bypass circuits 41 and 42.

(5) Since the memory circuits 40 and 52 latch the written data statically, the data, which are written in the memory circuits while the clock signal CLK is at the high level, can be stably outputted from the output terminals 33 and 34 while undesirably having their levels inverted by the influences of the capacitative coupling, the low leakage current and the alpha rays.

(6) The data can be outputted, while being kept away from the influences of the output load capacity, by the actions of the inverter gates G10 and G11, or G36 and G37 which are arranged at the upstream stage of the transfer gates T5 and T6.

(7) Since the inverter gate G4 or the like is arranged at the input stage of the clock signal CLK, the setup time, the hold time and the minimum clock pulse width for regulating the data writing operation can be prevented from being influenced by the gradient of the change in the input waveform of the clock signal CLK.

(8) Thanks to the aforementioned effects (6) and (7), the operations can be stabilized or their specifications can be unified regardless of the circuit structure, to which the flip-flop circuit is applied. Thus, the present invention can find its most proper application to the unit cell or standard cell of an automatic wiring line, in which the driving ability and capacitative load of the circuit to be connected with the input/output terminals of the flip-flop circuit are diverse for the individual semiconductor integrated circuits making actual use of that flip-flop circuit.

(9) Since not only the memory circuits but also the bypass circuits 41 and 42 are given the set/reset functions making use the common set signal S* and reset signal R*, the set/reset functions can be preferred to the control by the clock signal CLK even in the writing operation. In other words, the set/reset functions are preferred in the entire flip-flop circuit regardless of the state of the clock signal CLK.

(10) Since the non-inversion outputting bypass circuit 41 and the inversion outputting bypass circuit 42 are separately provided, they can easily be made to correspond to the structures of the flip-flop circuits having the non-inverted output and the inverted output.

(11) If the bypass circuits 41 and 42 are connected in parallel with the slave stage 52, it is easily possible to match the structure of the flip-flop circuit which is equipped with two memory circuits of the master and slave stages connected in series.

(12) Since the bypass circuits are constructed of the BI-CMOS circuit including the bipolar transistors and the MOS transistors, their driving abilities can be easily improved.

Although our invention has been specifically described in connection with its embodiments, it should not be limited thereto but can be modified in various manners without departing from its scope.

Figure 8B:
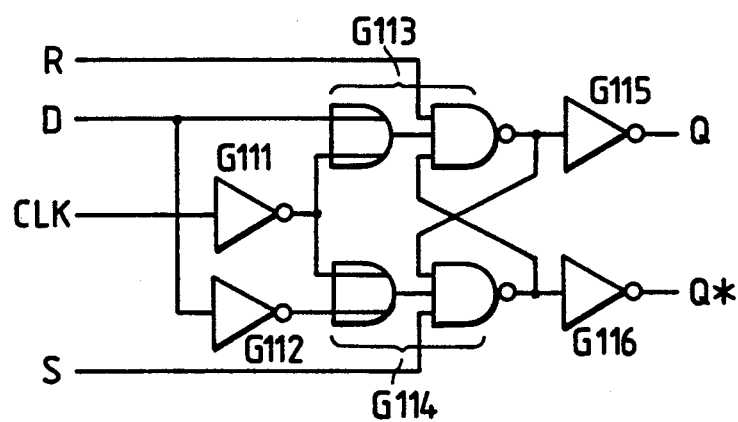

For example, the data storage type in the memory circuit should not be limited to that of the foregoing embodiments but can suitably adopt the structure of FIG. 8B or another circuit type.

Figure 7A:
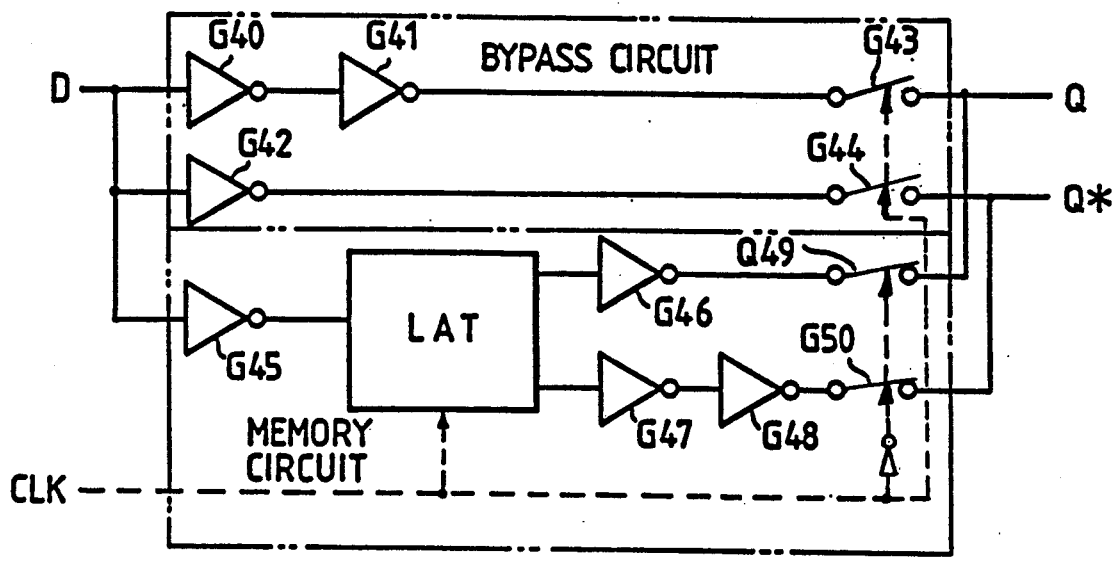
FIGS. 7A and 7B are circuit diagrams individually showing examples of another flip-flop circuit which is applied to a semiconductor integrated circuit device according to the present invention.
Figure 7B:
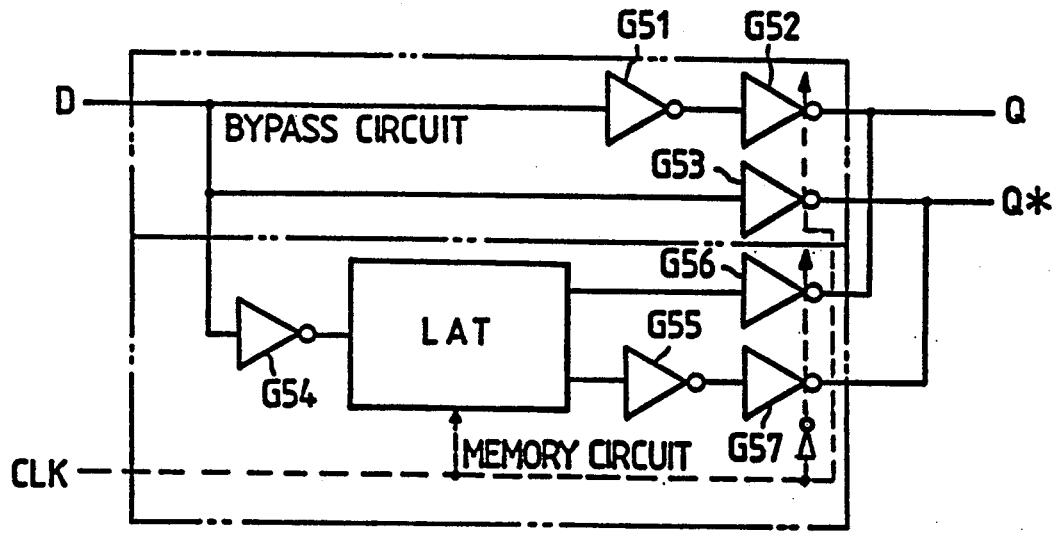

Moreover, the bypass circuits should not be limited to the combination of the clocked inverter gate and the transfer gate but can be constructed by using other gates. Although the flip-flop circuit of the foregoing embodiment shown in FIG. 5A is given the set/reset functions, the present invention should not be limited thereto but can have the two or one functions excluded therefrom. As shown in FIG. 7A, for example, the bypass circuit may be constructed of inverter gates G40 to G42 and switch gates G43 and G44 such as the transfer gates, and the memory circuit may be constructed of inverter gates G45 to G48, switch gates G49 and G50 such as the transfer gates, and a static latch LAT. As shown in FIG. 7B, still moreover, the bypass circuit may be constructed of an inverter gate G51 and clocked inverter gates G52 and G53, and the memory circuit may be constructed of inverter gates G54 and G55, clocked inverter gates G56 and G57, and a static latch LAT.

On the other hand, the foregoing embodiments are equipped with both the non-inverted output and the inverted output, one of which may be omitted. Moreover, the flip-flop circuit should not be limited to the level sense type but may be of the edge sense or edge trigger type. Still moreover, the operation characteristics of the flip-flop circuit to be built in the semiconductor integrated circuit according to the present invention should not be limited to those of the characteristic curve (a) of FIG. 4 and under the simulation condition but may be those speeded up according to the scaling rule of the MOS type semiconductor integrated circuit.

In the description thus far made, our invention has been described on the case, in which it is applied to the microprocessor constructed of the MOS type semiconductor integrated circuit backing the ground thereof. However, the present invention should not be limited thereto but can be widely applied to a variety of logical LSI. The present invention can be applied to the semiconductor integrated circuit device which is conditioned such that the operation performance of the flip-flop circuit arranged at least in the data transmission path exerts its influences upon the logical operation speed of the whole LSI.

The effects of the representative of the invention disclosed herein will be briefly described in the following.

Specifically, the bypass circuit connected in parallel with the memory circuit is constructed such that the number of series connected stages of the built-in gates is less than that of the memory circuit or such that the data transmission delay from the input to output terminals is smaller than that of the memory circuit. Thus, the normal data can be outputted at a high speed before the end of the writing operation of the memory circuit synchronized with the change in the clock signal. As a result, there can be attained an effect for speeding up the logical operation of the semiconductor integrated circuit device which has its performance determined by the clock signal cycle for regulating the operation of the flip-flop circuit.

Moreover, the semiconductor integrated circuit device is constructed of the MOS type semiconductor integrated circuit so that not only the flip-flop circuit but also the overall operations can be further speeded up according to the scaling rule by promoting the fine structure of the elements and the according drop of the supply voltage. As a result, there can be attained an effect of achieving the faster logical operations in respect of the performance of the flip-flop circuit without sacrificing the high integration and the low power consumption.

What is claimed is:

1. A semiconductor integrated circuit device having its logical operation timing controlled by a clock synchronization and having a memory means in which input data is latched statically, said memory means comprising:

a data input terminal to which said input data is inputted;

a data output terminal from which output data is outputted from said memory means;

a memory circuit, in which said input data is written and latched statically, coupled between said data input terminal and said data output terminal and having gate stages coupled between said data input terminal and data output terminal in series;

a bypass circuit coupled in parallel to said memory circuit and having a smaller number of gate stages coupled in series between said data input terminal and said data output terminal than said memory circuit; and, switch means for conducting said input data through the bypass circuit to said data output terminal when said memory circuit is in a write state, and for conducting said input data through said memory circuit to said data output terminal when said memory circuit is in a latch state, said switch means being controlled by a clock signal supplied from outside said memory means, wherein said bypass circuit has a high level setting means for setting a high level to said data output terminal and a low level setting means for setting a low level to said data output terminal, and wherein said high level setting means and said low level setting means are selectively activated according to a level of said input data.

2. The semiconductor integrated circuit device according to claim 1, wherein said memory circuit has a write control switch for selectively inputting said input data to said memory circuit or not, wherein said write control switch is controlled by said clock signal.

3. The semiconductor integrated circuit device according to claim 1, wherein said memory circuit includes a driver circuit for driving a load to be coupled to said output terminal, wherein a drive ability of said high level setting means and said low level setting means are substantially equal to or larger than that of said driver circuit.

4. The semiconductor integrated circuit device according to claim 2, wherein said data output terminal includes a non-inversion data output terminal and an inversion data output terminal, wherein said memory means is coupled to both said non-inversion data output terminal and said inversion data output terminal and outputs a non-inversion output data which is not inverted as to said input data to said non-inversion data output terminal and outputs and inversion output data which is inverted as to said input data to said inversion data output terminal, wherein said bypass circuit includes a first bypass circuit coupled between said data input terminal and said non-inversion data output terminal, and a second bypass circuit coupled between said input terminal and said inversion data output terminal, wherein said switch means conducts said first and second bypass circuits to said non-inversion data output terminal and inversion data output terminal, respectively, when said memory circuit is in said write state, and conducts said memory circuit to said non-inversion data output terminal and inversion data output terminal when said memory circuit is in said latch state.

5. The semiconductor integrated circuit device according to claim 1, wherein said bypass circuit conducts to said data output terminal and outputs said output data to said data output terminal in response to a first level of said clock signal and is not conducted to said data output terminal and does not output said output data to said data output terminal in response to a second level of said clock signal.

6. The semiconductor integrated circuit device according to claim 5, wherein said memory circuit does not conduct to said data output terminal and does not output said output data to said data output terminal in response to said first level of said clock signal and conducts said output data to said output data terminal in response to said second level of said clock signal.

7. The semiconductor integrated circuit device according to claim 1, wherein said semiconductor integrated circuit device is a microcomputer.

8. The semiconductor integrated circuit device according to claim 4, wherein said first bypass circuit conducts to said non-inversion data output terminal and outputs said output data to said non-inversion data output terminal in response to a first level of said clock signal and does not conduct said output data to said non-inversion data output terminal in response to a second level of said clock signal, and wherein said second bypass circuit conducts said output data to said inversion data output terminal in response to said first level of said clock signal and does not conduct said output data to said inversion data output terminal in response to said second level of said clock signal.

9. The semiconductor integrated circuit device according to claim 1 wherein said memory means is formed using a unit cell wherein wiring lines are made by means of design automation.

10. The semiconductor integrated circuit device according to claim 8, wherein said memory circuit conducts said output data to said non-inversion data output terminal in response to said first level of said clock signal and does not conduct said output data to said non-inversion data output terminal in response to said second level of said clock signal, and wherein said memory circuit conducts said output data to said inversion data output terminal in response to said first level of said clock signal and does not conduct said output data to said inversion data output terminal in response to said second level of said clock signal.

11. A semiconductor integrated circuit device having its logical operation timing controlled by a clock synchronization and having a memory means, wherein said memory means comprises:

a data input terminal to which input data is inputted;

a data output terminal from which output data is outputted from said memory means;

a memory circuit, in which said input data is latched statically, coupled between said data input terminal and said data output terminal and having first gate stages coupled in series between said data input terminal and data output terminal;

a bypass circuit coupled in parallel to said memory circuit and having second gate stages coupled in series between said input terminal and said output terminal; and, switch means for conducting said input data through the bypass circuit to said data output terminal when said memory circuit is in a write state, and for conducting said input data through the memory circuit to said data output terminal when said memory circuit is in a latch state, wherein said switch means is controlled by a clock signal supplied from outside said memory means, wherein said memory circuit has a first propagation delay time of a first value to propagate said input data from said data input terminal to said data output terminal through said first gate stages, wherein said bypass circuit has a second propagation delay time of a second value to propagate said input data from said data input terminal to said data output terminal through said second gate stages, wherein said second value is smaller than said first value, wherein said bypass circuit has a high level setting means for setting a high level to said data output terminal and a low level setting means for setting a low level to said data output terminal, wherein said high level setting means and said low level setting means are selectively activated according to a level of said input data.

12. The semiconductor integrated circuit device according to claim 11, wherein said memory circuit includes a driver circuit for driving a load to be coupled to said data output terminal and wherein a drive ability of said high level setting means and said low level setting means are substantially equal to or larger than that of said driver circuit.

13. The semiconductor integrated circuit device according to claim 11, wherein said memory circuit has a write control switch for selectively inputting said input data to said memory circuit, and wherein said write control switch is controlled by said clock signal.

14. The semiconductor integrated circuit device according to claim 11, wherein said bypass circuit conducts said output data to said data output terminal in response to a first level of said clock signal and does not conduct said output data to said data output terminal in response to a second level of said clock signal.

15. The semiconductor integrated circuit device according to claim 14, wherein said memory circuit does not conduct said output data to said data output terminal in response to said first level of said clock signal and conducts said output data to said data output terminal in response to said second level of said clock signal.

16. The semiconductor integrated circuit device according to claim 13, wherein said data output terminal includes a non-inversion data output terminal and an inversion data output terminal;

wherein said memory means is coupled to both said non-inversion data output terminal and said inversion data output terminal and outputs a non-inversion output data which is not inverted as to said input data to said non-inversion data output terminal and outputs an inversion output data which is inverted as to said input data to said inversion data output terminal;

wherein said bypass circuit includes a first bypass circuit coupled between said data input terminal and said non-inversion data output terminal, and a second bypass circuit coupled between said data input terminal and said inversion data output terminal;

wherein said switch means conducts said output data through the first and second bypass circuits to said non-inversion data output terminal and inversion data output terminal, respectively, when said memory circuit is in said write state, and conducts said output data through said memory circuit to said non-inversion data output terminal and inversion data output terminal when said memory circuit is in said latch state.

17. The semiconductor integrated circuit device according to claim 11, wherein said semiconductor integrated circuit device is a microcomputer.

18. The semiconductor integrated circuit device according to claim 11 wherein said memory means is formed using a unit cell wherein wiring lines are made by means of design automation.

19. A semiconductor integrated circuit device having its logical operation timing controlled by a clock synchronization and having a memory means in which input data is latched statically, wherein said memory means comprises:

a data input terminal to which said input data is inputted;

a data output terminal from which output data is outputted from said memory means;

two memory circuits of master and slave stages coupled in series between said data input terminal and said data output terminal;

a bypass circuit coupled in parallel to said slave stage memory circuit, wherein said input data are written and latched statically in said master stage memory circuit, wherein a data of said master stage memory circuit is written and latched statically in said slave stage memory circuit, wherein said bypass circuit has a smaller number of gate stages in series between said data input terminal and said data output terminal than the number of gate stages in series of said slave stage memory circuit between said data input terminal and data output terminal; and, switch means for conducting said input data through the bypass circuit to said data output terminal when said slave stage memory circuit is in a write state, and for conducting said input data through the slave stage memory circuit to said data output terminal when said slave stage memory circuit is in a latch state, wherein said switch means is controlled by a clock signal, wherein said bypass circuit has a high level setting means for setting a high level to said data output terminal and a low level setting means for setting a low level to said data output terminal, wherein said high level setting means and low level setting means are selectively activated according to a level of said clock signal.

20. The semiconductor integrated circuit device according to claim 11, wherein said slave stage memory circuit includes a driver circuit for driving a load to be coupled to said data output terminal, wherein a drive ability of said high level setting means and low level setting means are substantially equal to or larger than that of said driver circuit.

21. The semiconductor integrated circuit device according to claim 11, wherein said bypass circuit conducts said output data to said data output terminal in response to a first level of said clock signal and does not conduct said output data to said data output terminal in response to a second level of said clock signal.

22. The semiconductor integrated circuit device according to claim 21, wherein said slave stage memory circuit does not conduct said output data to said data output terminal in response to said first level of said clock signal and conducts said output data to said data output terminal in response to said second level of said clock signal.

23. The semiconductor integrated circuit device according to claim 19, wherein said semiconductor integrated circuit device is a microcomputer.

24. The semiconductor integrated circuit device according to claim 19, wherein said memory means is formed using a unit cell wherein wiring lines are made by means of design automation.

25. The semiconductor integrated circuit device according to claim 19, wherein said slave stage memory circuit has a write control switch for selectively inputting said data from said master stage memory circuit to said slave stage memory circuit or not, and wherein said write control switch is controlled by said clock signal.

* * * * *